April 16, 1968 J. J. GIBSON 3,378,783

OPTIMIZED DIGITAL AMPLIFIER UTILIZING INSULATED-GATE FIELD-EFFECT TRANSISTORS

Filed Dec. 13, 1965 4 Sheets-Sheet 1

Inventor:
J. JAMES GIBSON

BY John V. Regan
Attorney

Inventor:
J. JAMES GIBSON
BY John V. Regan
ATTORNEY

April 16, 1968 J. J. GIBSON 3,378,783

OPTIMIZED DIGITAL AMPLIFIER UTILIZING INSULATED-GATE FIELD-EFFECT TRANSISTORS

Filed Dec. 13, 1965 4 Sheets-Sheet 3

Inventor:
J. James Gibson

By John V. Regan
Attorney

Inventor:
J. JAMES GIBSON
By John V. Regan
Attorney

United States Patent Office 3,378,783
Patented Apr. 16, 1968

3,378,783

OPTIMIZED DIGITAL AMPLIFIER UTILIZING INSULATED-GATE FIELD-EFFECT TRANSISTORS

John James Gibson, Princeton, N.J., assignor to Radio Corporation of America, a corporation of Delaware Filed Dec. 13, 1965, Ser. No. 513,292
8 Claims. (Cl. 330—35)

ABSTRACT OF THE DISCLOSURE

An "optimized digital amplifier" is disclosed in which each amplifier stage includes at least one field-effect transistor having a source and a drain separated by a gap to define a conduction path. The gap of the transistor in the first stage has a width *w*; and the width of the gaps in succeeding stages increases in a geometric progression as set forth. The gain per stage and the number of stages is selected so as to yield a minimum delay of the entire amplifier.

This invention relates to amplifiers and in particular to digital amplifiers useful for driving large capacitive loads.

Large capacitive loads exist in some digital systems in the form of a plurality of identical solid state circuits, each of which has an input capacity. When each of the identical circuits is to be driven with the same digital signal, the individual capacities are effectively a large resultant load capacitance. Digital amplifiers are often used to apply the same digital signal simultaneously to a large plurality of identical solid state circuits. Desirably, the digital amplifier should perform this function with a minimum delay of the digital signal.

Advances in semiconductor integrated circuit technology have made it possible to fabricate large numbers of these identical solid state circuits in an integrated circuit structure. Accordingly, it is desirable that digital amplifiers associated with these solid state circuits also be capable of fabrication in a integrated circuit structure. In the interest of low power dissipation, high speed, and ease of fabrication, it is also desirable that the digital amplifier include only active semiconductor devices.

An object of the present invention is to provide a novel digital amplifier.

Another object of the invention is to provide a digital amplifier in which delay of the digital signal is minimized.

Yet another object of the invention is to provide a solid state digital amplifier in which the geometry of the solid state components in each stage is chosen so as to minimize the delay of a digital signal.

Still another object of the invention is to provide a solid state digital amplifier which includes only active components and which is readily fabricated in an integrated circuit structure.

Briefly stated, the present invention is embodied as an *m* stage digital amplifier. Each stage includes at least one field-effect transistor having a source and a drain separated by a gap to define a conduction path and a gate for controlling the conduction thereof. The gap of the transistor in the first stage has a width *w* and the transistor gap widths in succeeding stages become increasingly larger.

In one embodiment, there is one transistor in each succeeding stage which corresponds to the first stage transistor. In another embodiment, a plurality of transistors in each succeeding stage corresponds to the first stage transistor.

In the accompanying drawing, like reference characters denote like components; and FIG. 1 is a schematic circuit diagram of a digital amplifier embodying the present invention;

The active devices contemplated for use in practicing the invention are of a type known in the art as insulated-gate field-effect transistors. An insulated-gate field-effect transistor may generally be defined as a majority carrier field-effect device, which includes a body of semiconductive material. A gap or carrier conduction channel within the semiconductive body is bounded at one end thereof by a source region and at the other end thereof by a drain region. A gate or control electrode means overlies at least a portion of the gap or carrier conduction channel and is separated therefrom by a region of insulating material. Signals or voltages applied to the gate electrode means control, by field-effect, the conductance of the channel.

Two known types of insulated-gate field-effect transistors are the thin-film transistor (TFT) and the metal oxide semiconductor transistor (MOS). Some of the physical and operating characteristics of a thin-film transistor are described in an article, by P. K. Weimer, entitled, "The TFT—a New Thin-Film Transistor," appearing at pp. 1462–1469 of the June 1962, issue of the Proceedings of the IRE. The MOS transistor is described in an article entitled, "The Silicon Insulated-Gate Field-Effect Transistor," by S. R. Hofstein and F. P. Heiman, appearing at pp. 1190–1202 of the September 1963, issue of the Proceedings of the IEEE.

Such transistors may be of either the enhancement type or the depletion type. The enhancement type unit is of particular interest in the present application. In an enhancement type unit, the impedance of the conduction channel is very high when the gate and source voltages have the same value. A signal of the proper polarity applied between the gate and source decreases the impedance of the conduction channel. In a depletion type unit, the impedance of the conduction path is relatively low when the source and gate have the same voltage. Input signals of the proper polarity applied between the source and drain increase the impedance of the conduction path.

An insulated-gate field-effect transistor may be either a P-type or an N-type unit depending upon the conductivity type material of the semiconductive body. A P-type unit is one in which the majority carriers are holes; whereas, an N-type unit is one in which the majority carriers are electrons.

Figure 1:
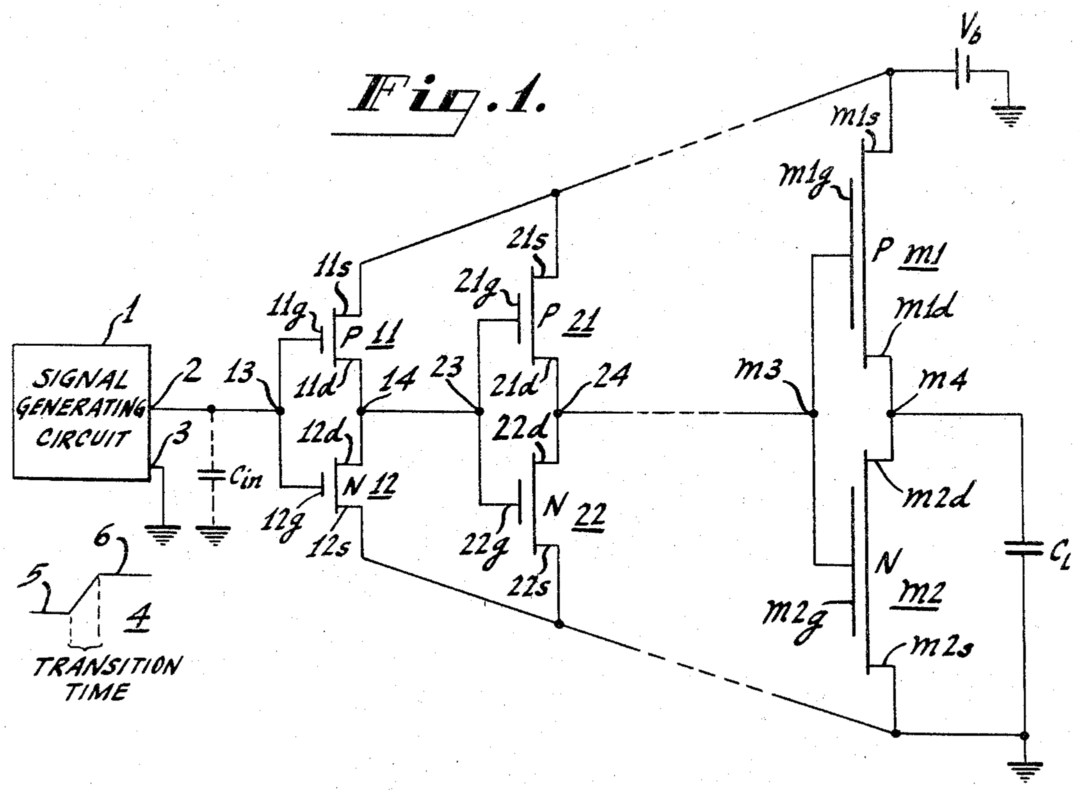

Referring now to FIG. 1, a digital amplifier embodying the invention includes *m* amplifying stages of substantially identical circuit configurations. Like circuit components in different stages are identified by reference characters of which the tens digit denotes the stage in which the circuit component is located and the units digit denotes the particular circuit component. Since each of the amplifying stages has a substantially identical circuit configuration, only the first stage will be described in detail.

The first amplifying stage includes a P-type transistor 11 and an N-type transistor 12, connected as an inverting type amplifier. To this end, the gate electrodes 11*g* and 12*g* are connected in common to an input 13. The drain electrodes 11*d* and 12*d* are connected in common to an output 14. The source electrode 11*s* is connected to the positive terminal of a bias supply voltage, illustrated as a battery $V_b$, the negative terminal of which is connected to circuit ground as shown by the conventional ground symbol in FIG. 1. The source electrode 12*s* is also connected to circuit ground.

The input 13 is further connected to a terminal 2 of a signal generating circuit 1. The other terminal 3 of the signal generating circut is connected to circuit ground. The signal generating circuit 1 includes suitable digital circuitry capable of developing between its terminals 2 and 3 digital signals of the type illustrated by the waveform 4. According to the waveform 4, the terminal 2 is at either the lower digital voltage level 5 or the higher digital level 6, the signal generating circuit being capable of switching between the two levels 5 and 6. In an exemplary digital system, the higher digital level may have a value of $+V_b$ volts, and the lower digital level may have a value of 0 volt. The signal generating circuit 1 is loaded by the input capacitance $C_{in}$ as illustrated by the dotted connection between the first stage input 13 and circuit ground. The input capacitance $C_{in}$ is the effective capacitance seen looking into the first stage from the input 13.

The first stage output 14 is connected to the second stage input 23; the second stage output 24 is connected to the third stage input (not shown) and the $m-l^{th}$ stage output is connected to the $m^{th}$ stage input *m*3. The $m^{th}$ stage output *m*4 is connected to a load capacitance $C_L$ which represents the load capacitance being driven. The load capacitance $C_L$ is significantly larger than the input capacitance $C_{in}$.

In steady state operation, if the input digital signal level has a value of $+V_b$ volts, the input capacitance $C_{in}$ is charged to $+V_b$ volts. The gate-to-source voltage of the P-type transistor 11 is substantially 0 volt, thereby biasing the P-type transistor into cut off. The gate-to-source voltage of the N-type transistor 12 has a value of $+V_b$ volts, thereby tending to bias the N-type transistor into a fully conductive condition. Consequently, the output 14 is at a digital level of substantially 0 volt.

On the other hand, when the input voltage is at 0 volt, the input capacitance $C_{in}$ is charged to 0 volt. The gate-to-source voltage of the P-type transistor 11 is substantially $-V_b$ volts; and the gate-to-source voltage of the N-type transistor 12 is at substantially 0 volt. Thus, the P-type transistor 11 is biased to a fully conductive condition and the N-type transistor 12 is biased into cut off. For this condition, the output 14 is at a digital level of approximately $+V_b$ volts. Consequently, the first amplifying stage provides at its output 14 an inversion of the digital levels $+V_b$ volts or 0 volt which are applied to the input 13.

Like the first stage, the second, third, . . . and the $m^{th}$ amplifying stages are also operative as inverting type amplifiers. If the number of stages *m* is even, the digital amplifier is a non-inverting type: if *m* is odd, the digital amplifier is an inverting type.

During the transient; that is, whenever the signal generating circuit 1 is switching from one to the other of the digital levels 5 and 6, the input capacitance $C_{in}$ charges or discharges. The digital amplifier responds to the charging or discharging of the input capacitance $C_{in}$ to charge or discharge the load capacitance $C_L$ after a delay occasioned by the overall amplifier. The present invention minimizes this delay by appropriate selection of the gap or conduction channel geometry and by appropriate selection of the number *m* of amplifying stages.

The gap geometry of the transistors is such that the spacings between the source and drain electrodes of all the transistors in the digital amplifier are identical; but the widths of the gaps vary from stage to stage. The width of a gap is the dimension transverse to the spacing between the source and drain and parallel to the plane of the gate electrode. The gap widths of the first stage transistors 11 and 12 are selected in accordance with the capacitance which the signal generating circuit is capable of driving with substantially no degradation of the rise or fall time of the signal transient. The gap widths of the transistors in an amplifying stage are essentially proportional to the input capacitance of the stage, the proportionality constant being determined by the mode of fabrication. Thus, for a given input capacitance $C_{in}$, the gap widths of the first stage transistors 11 and 12 are readily determined.

For a given number of stages *m* and a given load capacitance $C_L$, the transistor gap widths in succeeding stages increase in a geometric progression by a factor *k*, where $$k=\sqrt[m]{\frac{C_L}{C_{in}}} \qquad (1)$$

Thus, if *w* is the given gap width in the first stage, the gap width in the second stage is *kw*; in the third stage, $k^2w$; and finally in the last stage, $k^{m-1}w$.

In the preceding paragraph, it is assumed that the gap widths of the P and N-type transistors in each stage are identical. For the case where the first stage P and N-type transistors have different gap widths $w_p$ and $w_n$, the corresponding P and N-type transistor gap widths in succeeding stages increase in a geometric progression by the factor *k*.

Figure 2:
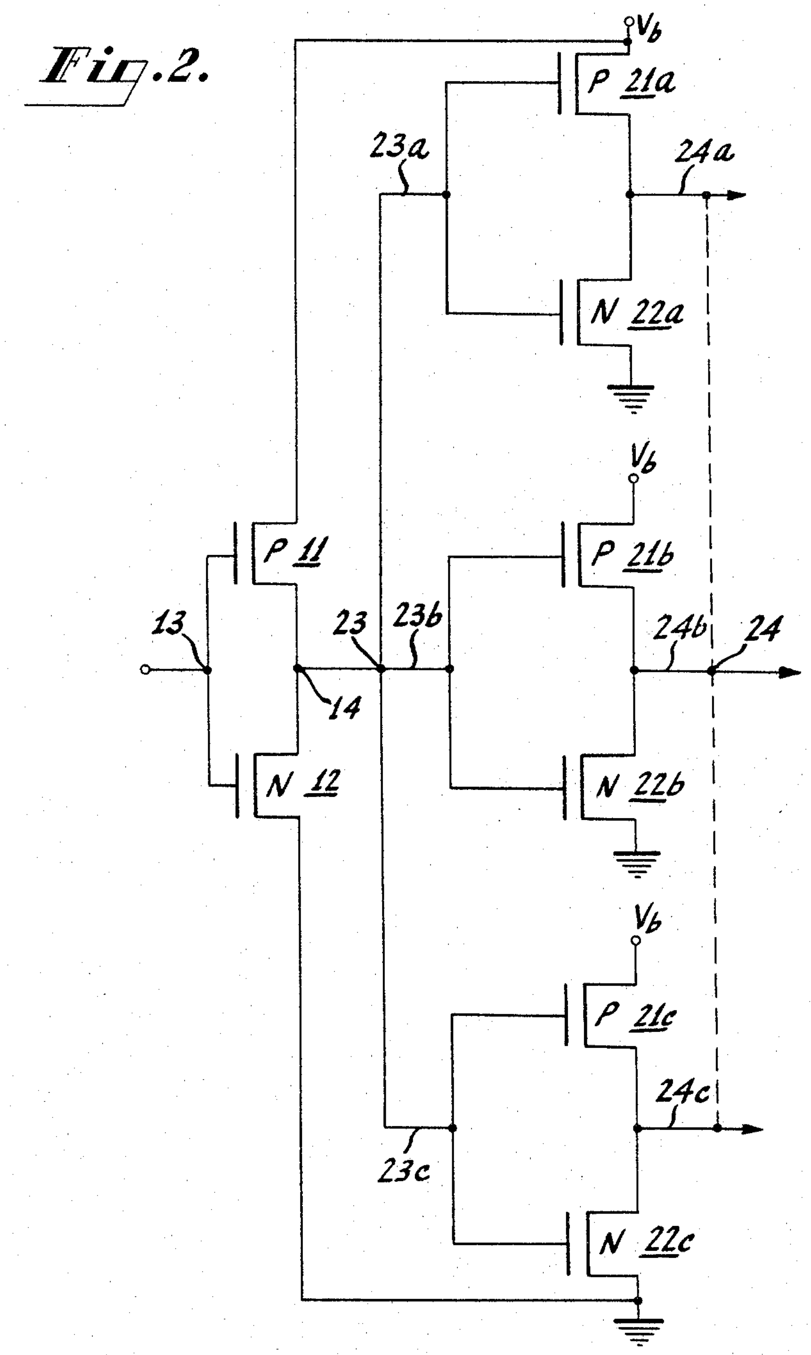
FIG. 2 is a circuit diagram of a variation of the digital amplifier of FIG. 1.

The digital amplifier may be embodied in other configurations. In FIG. 2 for example, the second stage of the amplifier has a plurality of P-N inverters connected in parallel. Although the plurality may be any number in excess of one, three inverters are used to illustrate the embodiment. Thus, the input connections 23*a*, 23*b* and 23*c* are connected in common to the second stage input 23. The source electrodes of transistors 21*a*, 21*b* and 21*c* are all connected to the positive terminal of the battery $V_b$; and the source electrodes of the transistors 22*a*, 22*b* and 22*c* are all connected to circuit ground. The sum of the gap widths of the P-type transistors 21*a*, 21*b* and 21*c* is equal to $kw_p$. The sum of the gap widths of the N-type transistors 22*a*, 22*b* and 22*c* is equal to $kw_n$.

In the circuit arrangement of FIG. 2, it is apparent that the voltage level at the second stage output points 24*a*, 24*b* and 24*c* are identical. Consequently, these output connections can be directly connected to separate input connections of the next succeeding stage or directly connected to the load circuitry. On the other hand, the outputs 24*a*, 24*b* and 24*c* could be connected in common to the second stage output 24 as illustrated by the dashed connections in FIG. 2.

For ease of illustration, only two stages of the digital amplifier have been shown in FIG. 2. Succeeding stages of the amplifier may also include a plurality of P-N inverters connected in parallel similar to the second stage.

Figure 3:
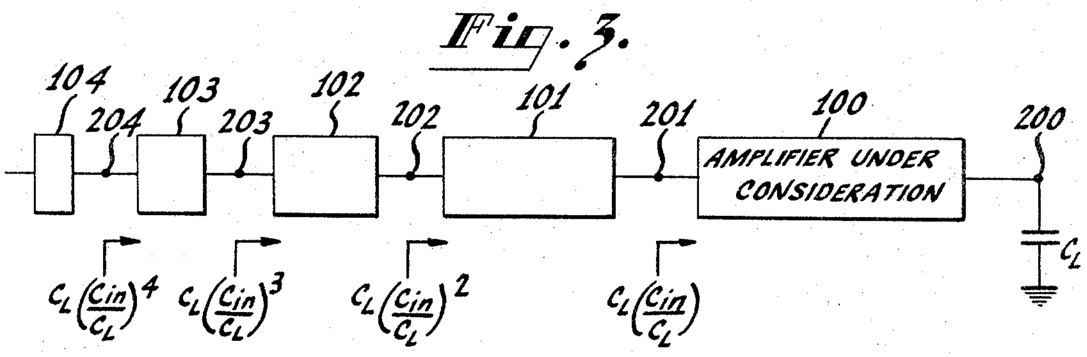
FIG. 3 is a block diagram of a long chain of the FIG. 1 digital amplifiers useful for describing the delay and gain of the digital amplifier.

In order to more clearly define what is meant by delay of amplification, refer now to FIG. 3, where the *m* stage digital amplifier 100 is the one under consideration. Like the digital amplifier in FIG. 1, this amplifier 100 has an input capacitance $C_{in}$ and a load capacitance $C_L$. A long chain of similar *m* stage amplifiers 101, 102, 103, . . . etc. drives the amplifier 100. The transistor gap widths in the preceding amplifier 101 are scaled down by a factor $$\frac{C_{in}}{C_L}$$

The transistor gap widths in the next preceding amplifier 102 are correspondingly scaled down by a factor $$\left(\frac{C_{in}}{C_L}\right)^2$$

and so on with the scaling continuing in a geometrical progression backwards.

Under these conditions, it is apparent that a digital signal, which switches from one to the other of the digital signal levels, has substantially the same wave shape at the output points 200, 202, 204, . . . , and so on, except that the signal transient at the output point 200 is delayed by a certain time 2D with respect to the waveform at the output point 202, which, in turn, is delayed with respect to the waveform at the point 204 by the time 2D, and so on. The reason for these identical voltage waveforms is that the capacitances as well as the currents at the output point 202 are similar to those at the output point 200, differing therefrom by a factor $$\left(\frac{C_{in}}{C_L}\right)^2$$

In fact, this transient waveform, propagating through the $m$ stage amplifier 100 has the same wave shape at any two points therein between which there are two inverting stages, except that the output waveform of this pair of inverting stages is delayed a time $2d$ with respect to the input waveform of the pair. Consequently, the pair delay is defined as $2d$; the stage delay, as $d$; and the entire amplifier 100 delay as D.

In FIG. 3, the load capacitance $C_L$ at the output point 200 is charged or discharged at substantially the same rate as the capacitance at the output point 202, which capacitance is smaller than the load capacitance $C_L$ by a factor $G^2$, where $$G^2=\left(\frac{C_L}{C_{in}}\right)^2 \quad (2)$$

Consequently, an effective amplification of $G^2$ occurs from the output point 202 to the output point 200. Therefore, the gain or fan-out G of the amplifier under consideration is $$G=\frac{C_L}{C_{in}} \quad (3)$$

The fan-out or gain per stage of the digital amplifier, then, is the factor $k$. Equation 1 can be re-written as follows:

$$k=\sqrt[m]{G} \quad (4)$$

Solving for $m$ $$m=\frac{\log G}{\log k} \quad (5)$$

With the delays in the various stages being equal, the delay D of the entire digital amplifier is the delay d per stage times the number of stages:

$$D=md \quad (6)$$

The delay $d$ per stage is generally a function of the gain or fan-out $k$ per stage which can be expressed by the Taylor Series as $$d(k)=d(0)+kd'(0)+\frac{k^2}{2}d''(o)+\cdots \quad (7)$$

Very often the first two terms of the Taylor Series is a good approximation of the function $d(k)$, especially for capacitive input devices, such as field-effect transistors. The factor $d(o)$ is proportional to the effective output capacitance per unit gap width of the driving transistor stage. The factor $d'(o)$ is proportional to the input capacitance per unit gap width of the driven transistor stage.

Substituting Equation 5 and the first two terms of the Taylor Series in Equation 6, the delay D becomes $$D=\frac{\log G}{\log k}d(k) \quad (8)$$

and $$D=\left[\frac{k+\frac{d(o)}{d'(o)}}{\log k}\right]d'(o)\log G \quad (9)$$

Figure 4:
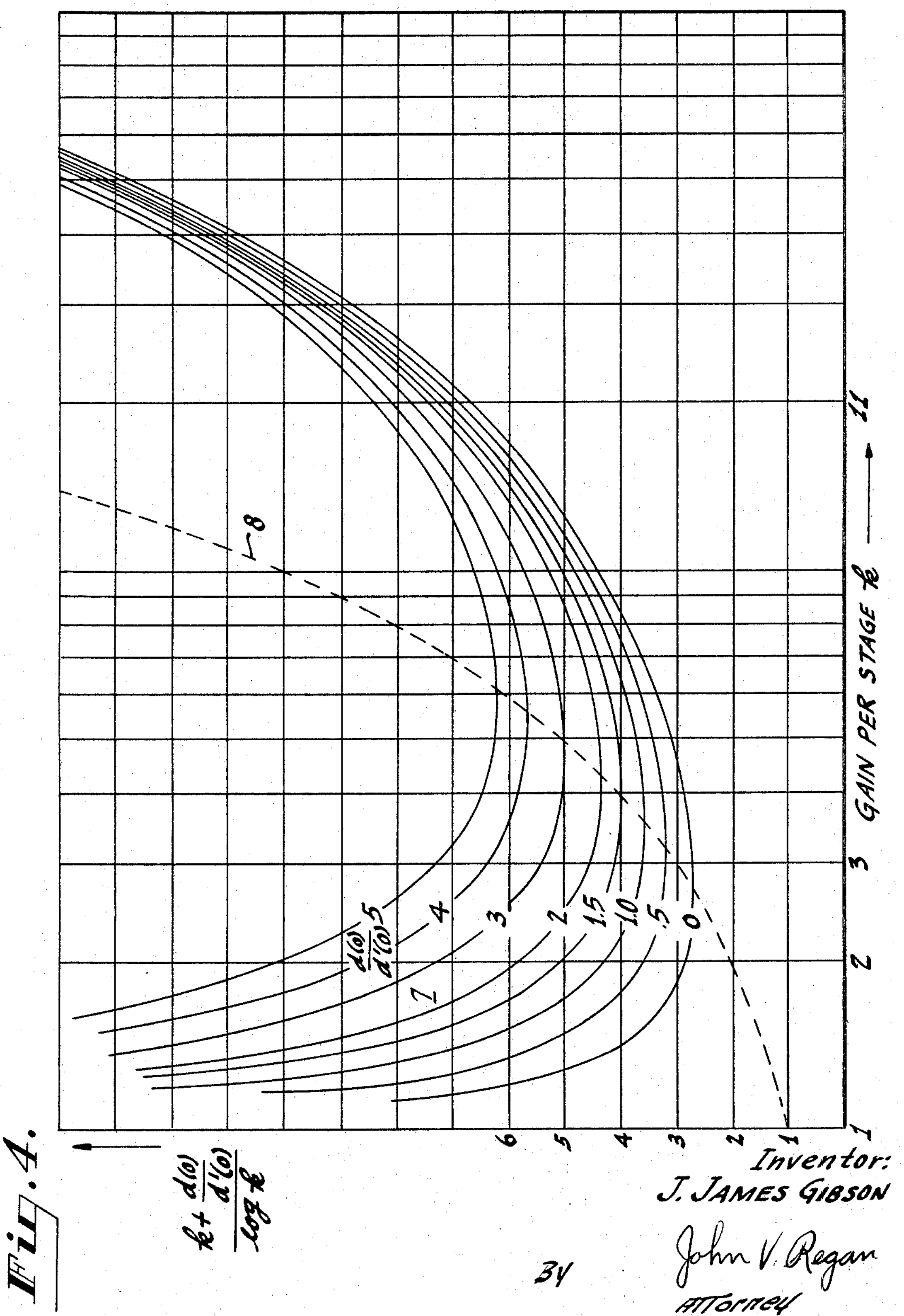
FIG. 4 is a graph depicting an optimum gain per stage for a minimum delay of the digital amplifier.

The bracketed term in Equation 9 is plotted in FIG. 4 as the ordinate with a linear scale and the gain per stage $k$ is plotted as the abscissa with a logarithmic scale. The ratio $$\frac{d(o)}{d'(o)}$$

serves as a parameter to generate a family of curves 7. The dashed curve 8 represents the locus of the minimum value of the bracketed term (which term is essentially proportional to the delay D) for an optimum fan-out or gain $k$.

It is apparent, then, that for a given value of $$\frac{d(o)}{d'(o)}$$

there is an optimum value of $k$ which yields a minimum value of delay D. This optimum value of $k$ also determines the optimum number of stages $m$ from Equation 5. Since the number of stages $m$ must be an integer, $m$ is selected to be the closest odd integer to the computed value for an inverting type amplifier and the closest even integer for a non-inverting type amplifier.

It should be noted that in some cases, a digital amplifier having a lesser number of stages than the optimum may yield a larger delay D than a digital amplifier having the pitimum number of stages. For example, consider the following illustration. In a particular digital system, the load capacitance $C_L$ has a value of 2,560 picofarads while the input capacitance $C_{in}$ of a non-inverting amplifier has a value of 10 picofarads. Consider that for a particular mode of transistor fabrication, $$\frac{d(o)}{d'(o)}$$

is one. According to FIG. 4, the $$\frac{d(o)}{d'(o)}=1$$

curve and the curve 8 intersects at a value of about 3.6 for $k$. For a non-inverting type amplifier, the number of stages $m$ should be selected as the closest even integer to the value of $m$ computed according to Equations 3 and 5, which turns out to be 4.38. Thus, $m$ is selected to be 4. In Equations 2 and 4, the gain per stage $k$ is also 4. Substituting these values into Equation 9, the delay D becomes equal to $20d'(o)$.

On the other hand, if $m$ is selected to be 2, the gain per stage $k$ is 16. Substituting these values into Equation 9, the delay D becomes $34d'(o)$. Consequently, it is seen that the optimum number of stages yields a smaller delay than a lesser number of stages yields.

Figure 5:
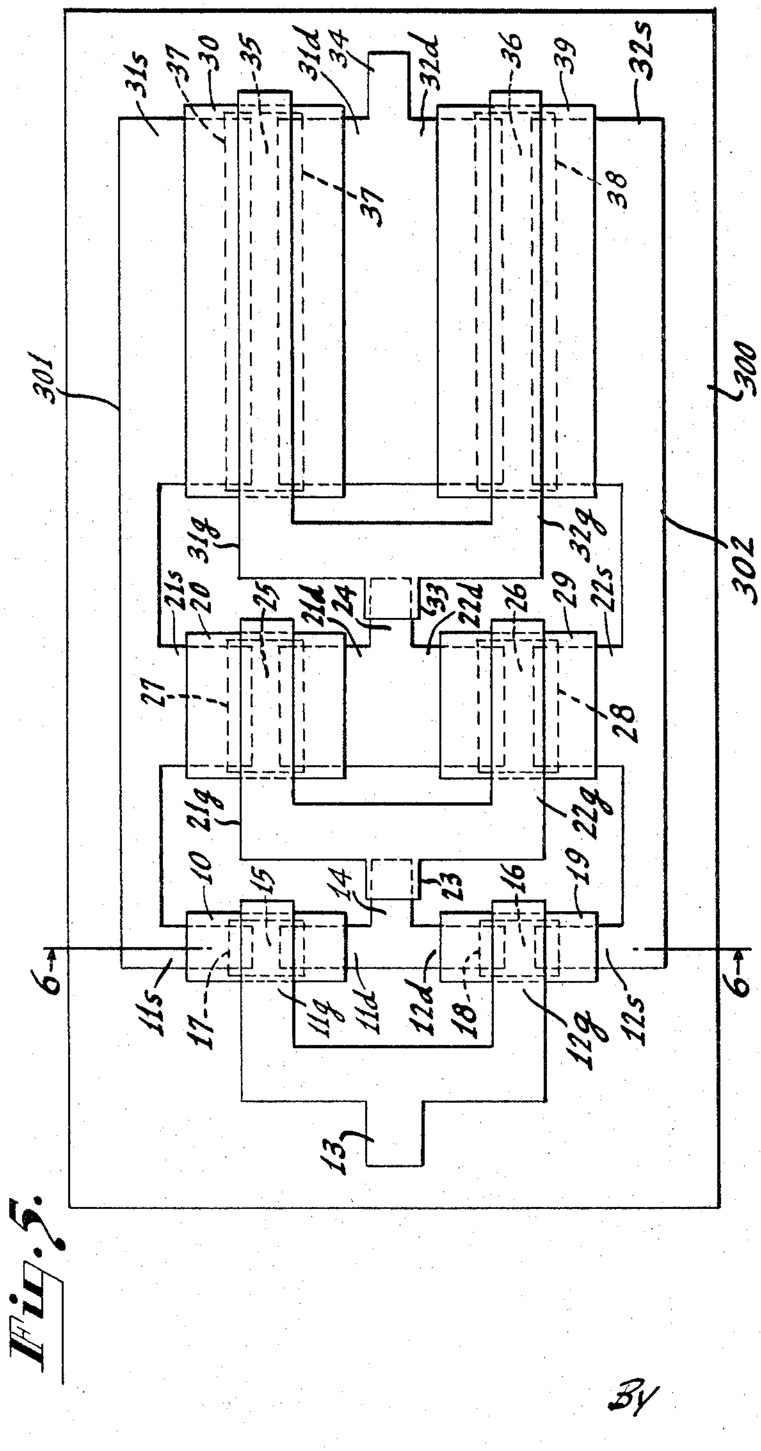
FIG. 5 is a plan view of an exemplary geometry which the digital amplifier of FIG. 1 may take in an integrated circuit structure.
Figure 6:
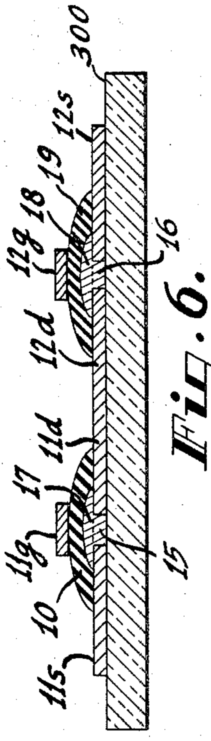
FIG. 6 is a cross sectional view taken along the line 6—6 in FIG. 5.

The digital amplifier embodied in FIG. 1 is readily fabricated in integrated circuit structures with either TFT or MOS transistors. By way of example, FIGS. 5 and 6 illustrate one geometry which a three stage amplifier may take in integrated form with TFT transistors. The integrated circuit structure has an insulating support or substrate 300, such as glass. On the top surface of substrate 300 is a land 301 from which source electrodes 11*s*, 21*s*, and 31*s* extend outwardly therefrom. Also on the top surface of substrate 300 is a land 302 from which source electrodes 12*s*, 22*s* and 32*s* extend outwardly therefrom toward source electrodes 11*s*, 21*s* and 31*s*. Drain electrodes 11*d* and 12*d* are spaced apart from source electrodes 11*s* and 12*s* by gaps 15 and 16, respectively. The drain electrodes 11*d* and 12*d* are joined to the first stage output connection 14. Drain electrodes 21*d* and 22*d* are spaced apart from source electrodes 21*s* and 22*s* by gaps 25 and 26, respectively. The drain electrodes 21*d* and 22*d* are joined to the second stage output conection 24. Drain electrodes 31*d* and 32*d* are spaced apart from source electrodes 31*s* and 32*s* by gaps 35 and 36, respectively. The drain electrodes 31*d* and 32*d* are joined to the third stage output connection 34. The source and drain electrodes and the output connections may suitably consist of a metal such as gold. Thin films 17, 18, 27, 28, 37 and 38 of semiconductor material overlie the gaps 15, 16, 25, 26, 35 and 36, respectively, and their associated source and drain electrodes. For example, the thin semiconductor film 17 overlies the gap 15 and the source electrode 11*s* and the drain electrode 11*d*. The films 17, 27 and 37 are P-type semiconductor material, such as tellurium. The films 18, 28, and 38 are N-type semiconductor material such as cadmium sulphide or cadmium selenide.

Layers 10, 19, 20, 29, 30 and 39 of insulating material overlie the semiconductor films 17, 18, 27, 28, 37 and 38, respectively. The insulating layers may suitably be a material such as silicon monoxide, silicon dioxide, calcium fluoride, aluminum oxide, zinc sulphide, and the like. Gate electrodes 11*g*, 12*g*, 21*g*, 22*g*, 31*g* and 32*g* are deposited on the insulating layers 10, 19, 20, 29, 30, and 39, respectively. The gate electrodes 11*g*, 12*g*, 21*g*, 22*g*, 31*g* and 32*g* overlie the gaps 15, 16, 25, 26, 35, and 36, respectively, and partly overlap the associated drain and source electrodes. The gate electrodes 11*g* and 12*g* are joined to the input terminal 13. The second stage input 23 joins the gate electrodes 21*g* and 22*g* to the first stage output 14. The third stage input 33 joins the gate electrodes 31*g* and 32*g* to the second stage output 24.

The drain and source electrodes and the gate electrodes may be deposited on the insulator substrate 300 and the insulating layers 10, 19, 20, 29, 30 and 39, respectively, by conventional techniques such as vacuum evaporation through a mask.

In FIGS. 5 and 6, the distance between a source and a drain electrode is considered to be the spacing of the conduction channel or gap; while the dimension perpendicular thereto is considered as the width of the conduction channel or gap. As can be seen in FIG. 5, the gap widths of the P and N transistors in each stage are equal. However, the gap widths of the second stage transistors 21 and 22 are $k$ times the gap width of the first stage transistors 11 and 12, where $k$ is the gain per stage. Similarly, the gap widths of the third stage transistors 31 and 32 are $k^2$ times the gap widths of the first stage transistors 11 and 12.

The preceding description of a thin film transistor geometry is intended to be merely illustrative, and other geometrics can be used. For example, the geometry of the drain and source electrodes may be an interlaced fork structure such as described in copending application, Ser. No. 501,210 filed Oct. 22, 1965, by Robert A. Powlus and entitled "Insulated Gate Field Effect Devices With Improved Capacitance Characteristics."

What is claimed is:

1. An amplifier having a gain G and a delay D comprising $m$ stages with a gain $k$ per stage, the first of said $m$ stages including at least one field-effect transistor having a source means and a drain means separated by a gap to define a conduction path and a gate means for controlling the condition thereof, said first stage field-effect transistor having a gap width $w$, each succeeding stage having field-effect transistor means with gap means, the total width of said gap means in said succeeding stages increasing in a geometric progression by a factor $k$, where $$k=\sqrt[m]{G}$$

2. The invention as claimed in claim 1 wherein each stage has a delay $d(k)$, and wherein $k$ has a value which substantially yields a minimum value of the delay D in the relation $$D=\frac{\log G}{\log k}d(k)$$

3. The invention as claimed in claim 1 wherein said field-effect transistor means includes at least one field-effect transistor having a source means and a drain means separated by said gap means to define a conduction path and a gate means for controlling the conduction thereof.

4. The invention as claimed in claim 1 wherein said field-effect transistor means includes a plurality of field-effect transistors each having a source means and a drain means,
wherein said gap means comprises individual gaps separating each associated source and drain means to define a plurality of conduction paths, said total width being the sum of the widths of said individual gaps, and
wherein said plurality of field-effect transistors include gate means for controlling the conduction of said paths.

5. The invention as claimed in claim 3 wherein each of said stages includes at least one other field-effect transistor having a source means and a drain means separated by a gap to define a conduction path, said gate means controlling the conduction thereof,
means for coupling one end of the conduction paths of said one and said other transistors in each stage in common to the gate means of the next succeeding stage, and
individual electrical connections to the other ends of the conduction paths of said one and said other transistors in each stage.

6. The invention as claimed in claim 5 wherein each stage has a delay $d(k)$ expressible as a function of $k$, $d(k)$, and
wherein $k$ has a value which substantially yields a minimum value of the delay D in the relation $$D=\frac{\log G}{\log k}d(k)$$

7. The invention according to claim 5 wherein said one and other transistors in each stage are opposite conductivity types.

8. The invention according to claim 4 wherein each stage has a delay $d(k)$, and
wherein $k$ has a value which substantially yields a minimum value of the delay D in the relation $$D=\frac{\log G}{\log k}d(k)$$

References Cited

UNITED STATES PATENTS 3,265,981 8/1966 Dill -------------- 330—38 X

JOHN KOMINSKI, *Acting Primary Examiner.*

ROY LAKE, *Examiner.*

J. B. MULLINS, *Assistant Examiner.*